United States Patent [19]
Iijima et al.

[11] Patent Number: 5,153,384
[45] Date of Patent: Oct. 6, 1992

[54] CIRCUIT BOARD AND PROCESS FOR MANUFACTURING SAME

[75] Inventors: Takahiro Iijima; Shinichi Wakabayashi, both of Nagano, Japan

[73] Assignee: Shinko Electric Industries, Co., Ltd., Nagano, Japan

[21] Appl. No.: 572,232

[22] Filed: Aug. 24, 1990

[30] Foreign Application Priority Data

Aug. 26, 1989 [JP] Japan .................................. 1-219258

[51] Int. Cl.$^5$ ............................................... H05K 1/00
[52] U.S. Cl. .................................... 174/257; 174/259; 174/264
[58] Field of Search ................ 174/250, 251, 256, 257, 174/258, 259, 260, 264; 437/189, 190, 192; 156/901, 902

[56] References Cited

U.S. PATENT DOCUMENTS

| | | | |
|---|---|---|---|
| 3,791,858 | 2/1974 | McPherson | 174/264 X |
| 4,511,757 | 4/1985 | Ors | 174/258 X |
| 4,554,229 | 11/1985 | Small | 174/258 X |
| 4,661,214 | 4/1987 | Young | 174/256 X |
| 4,786,523 | 11/1988 | Dohya | 174/257 X |
| 4,847,445 | 7/1989 | Helderman | 174/256 |
| 4,963,512 | 10/1990 | Iwanaga et al. | 437/192 |

OTHER PUBLICATIONS

Poley, N. M.; *Cermet Protective Layer at Metal-Dielectric overcoat Interface*, IBM Technical Disclosure Bulletin, vol. 15 No. 10 Mar. 1973.

Kolly, J. M. and T. D. Zucconi, *Laminated PC Board System*, IBM Technical Disclosure Bulletin, vol. 21 No. 6 Nov. 1978.

Greer, S. E. *Fabrication of Solid Via Structures in Organic Polymers*, IBM Technical Disclosure Bulletin, vol. 19, No. 3 Aug. 1976.

E. J. Webb, F. J. Bolda, T. J. Walsh, *Flush Molding of Printed Circuitry*, IBM Technical Disclosure Bulletin vol. 8, No. 8 Jan. 1966.

Primary Examiner—Leo P. Picard
Assistant Examiner—Trinidad Korka
Attorney, Agent, or Firm—Staas & Halsey

[57] ABSTRACT

A circuit board comprising a base having a substantially flat surface and an insulative layer made of a heat-resisting synthetic resin formed on the flat surface of the base. The insulative layer is provided with grooves for forming conductive parts, and each of the groove is defined by a bottom surface formed by the base and side walls formed by the insulative layer. A conductive adhesive layer having a good adhesion characteristic with respect to the base, such as Cr, is formed on the bottom surface of the grooves, and a conductive layer is formed on the conductive adhesive layer so that a surface defined by the insulative layer and the conductive parts including the conductive layer and conductive adhesive layer is substantially flat.

8 Claims, 3 Drawing Sheets

CIRCUIT BOARD AND PROCESS FOR MANUFACTURING SAME

BACKGROUND OF THE INVENTION

1. Field of the Invention

This invention relates to an electrical circuit or pattern board or substrate, hereinafter referred to as "circuit board", and a process for manufacturing such a circuit board.

More particularly, this invention relates to a circuit board in which a plurality of layers of circuit patterns, such as signal patterns, are formed via insulative layers made of, for example, a synthetic resin such as a polyimide.

The various requirements for a semiconductor device or an electronic system having a semiconductor device mounted thereon have become more and more severe, since these systems are highly sophisticated and complicated, and some of these requirements, for example, high speed signal transmission lines, an effective prevention of signal wave strain, and a high density of the signal transmission lines, must be precisely met.

For example, to reduce a resistance of the signal transmission lines, a cross-sectional area of these signal transmission lines must be maintained to a certain extent, a metal material having a low electrical resistance must be used, and an impedance, inductance, capacitance or the like of the material used must be taken into consideration. Also, a material having a low dielectric constant must be used as a basic material or insulative material, to prevent a lowering of the signal transmission speed.

Further, to make it possible to obtain a more complicated pattern for the signal transmission lines, it has been proposed that multi-layered transmission lines be formed.

Thus, the present invention concerns a circuit board in which multi-layer circuit patterns, such as the patterns for signal transmission lines, are formed via insulative layers made of, for example, a synthetic resin having a low dielectric constant, such as polyimide.

2. Description of the Related Art

A conventional process for forming multi-layer circuit patterns comprises, as shown in FIGS. 6A and 6B, forming a conductive pattern 4 on a basic material 3 by using a photoresist 2, and forming insulative layers 5 on the conductive pattern 4. In this case, usually a photoresist 2 is used, whereby a conductive line forming pattern is first formed on the base material 3, a conductive pattern 4 is formed on the base 3, and the photoresist 2 is then removed to form insulative layers 5.

Another known process comprises: forming a conductive metal layer on a base 3, using a photoresist to form an etching pattern, and etching the conductive metal layer to form a conductive pattern 4.

In the conventionally known process for forming multi-layer circuit patterns, after the conductive pattern 4 is formed, the base 3 and the conductive pattern 4 are covered with an insulative layer 5 as mentioned above, but the surface of the insulative layer 5 may become uneven or contain undulations when the base 3 and the conductive pattern 4 are covered with the insulative layer 5, due to the protrusion of the conductive parts 4 from the base 3.

A signal pattern may be further formed as multi-layered patterns, or a semiconductor chip may be mounted, on an upper layer of the insulative layer 5, and therefore, the surface of the insulative layer 5 must be as flat and even as possible. For example, if a high density semiconductor chip is mounted on or connected thereto, the roughness of the surface of the insulative layer must be less than $3\mu$. Further, if a more sophisticated circuit pattern is required, more severe conditions with regard to the surface roughness must be satisfied.

Accordingly, a process for smoothing the undulated surface of the insulative layer is necessary, and currently, a lapping process is used for smoothing that surface. Such a lapping process, however, is time and labor consuming and is not particularly effective.

SUMMARY OF THE INVENTION

Accordingly, an object of the present invention is to provide a circuit board in which multi-layer circuit patterns are formed via an insulative layer, and the surface of the insulative layer is smooth enough to ensure a high quality of the multi-layer circuit patterns.

Another object of the present invention is to provide a process for manufacturing such a circuit board, which overcomes the disadvantages mentioned hereinbefore with reference to the known process therefore.

According to the present invention, there is provided a circuit board comprising: a base and an insulative layer made of a heat-resisting synthetic resin formed on the base, the insulative layer being provided with grooves for forming conductive parts thereon, and each of the grooves being defined by a bottom surface formed by the base and side surfaces formed by the insulative layer; a conductive adhesive layer made of, for example, chromium (Cr), formed on the bottom surfaces of the grooves, the conductive adhesive layer having a good adhesion characteristic with respect to the base; and a conductive layer formed on the conductive adhesive layer. The conductive layer may be made of copper (Cu); the base may be made of ceramics or a synthetic resin; and the insulative layer may be made of polyimide. The Cr may be replaced by any metal material having a good adhesive characteristic with respect to an insulative material; for example, molybdenum (Mo), tungsten (W), zirconium (Zr), an alloy of titanium and tungsten (Ti-W), nickel (Ni), cobalt (Co), palladium (Pd), or gold (Au) can be used as the conductive adhesive layer. Preferably a polyimide is used for the insulative layer, since the polyimide has a low dielectric constant and a good insulation characteristic.

According to another aspect of the present invention, there is provided a circuit board comprising: a base having a substantially flat surface and a first insulative layer made of heat endurable synthetic resin formed on the flat surface of the base; the first insulative layer being provided with grooves for forming conductive parts thereon, and each of the grooves being defined by a bottom surface formed by the base and side surfaces formed by the insulative layer; first conductive adhesive layers formed on the bottom surfaces of the grooves, the first conductive adhesive layer having a good adhesion characteristic with respect to the base; conductive layers formed on the respective conductive adhesive layers; and second conductive adhesive layers formed on the respective conductive layers so that a thickness of the first insulative layer is substantially the same as a thickness of a conductive part including the conductive layer and the first and second conductive adhesive layers, whereby a surface defined by the second conductive adhesive layer and the first insulative layer is substantially flat.

In a further aspect of the present invention, there is provided a process for manufacturing a circuit board, comprising the following steps of: forming a thin conductive adhesive layer on a base made of ceramics or a synthetic resin, in accordance with a prescribed pattern for forming signal lines or the like, the conductive adhesive layer having a good adhesive characteristic with respect to the base; providing an insulative layer made of a heat-resisting synthetic resin on the base, except at regions of the pattern of the conductive adhesive layer, a thickness of the insulative layer being larger than that of the conductive adhesive layer; and forming a conductive layer on the conductive adhesive layer in such a manner that the thickness of the insulative layer is substantially the same as that of the conductive portions, including the conductive adhesive layer and the conductive layer.

In a still further aspect of the present invention, there is provided a process for manufacturing a circuit board, comprising the following steps of: providing an insulative layer made of a heat-resisting synthetic resin on a base made of ceramics or a synthetic resin; forming grooves on the insulative layer in accordance with a prescribed pattern for forming signal lines or the like, each of the grooves being defined by the bottom surface formed by the base and side walls formed by the insulative layer; forming a thin conductive adhesive layer on the bottom surface of the groove, the conductive adhesive layer having a good adhesive characteristic with respect to the base and/or the insulative layer; and forming a conductive layer on the conductive adhesive layer in such a manner that the thickness of the insulative layer is substantially the same as that of the conductive portions, including the conductive adhesive layer and the conductive layer.

According to a process of this invention, the surface of the underlayer, on which the covering insulative layer is formed, is first made smooth, and therefore, it becomes possible to make the upper surface of the covering insulative layer very smooth without steps or undulations. Accordingly, a process for smoothing the surface of the upper insulative layer can be omitted, to thereby simplify the process of manufacturing a circuit board using a base made of ceramics or a synthetic resin. Also, the multi-layer conductive patterns can be easily formed, due to the very smooth surface of the upper insulative layer.

DESCRIPTION OF THE PREFERRED EMBODIMENTS

Figure 1A:
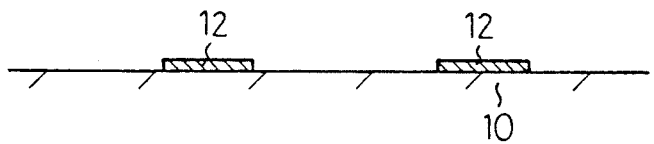
FIGS. 1A-1D are cross-sectional views illustrating an embodiment of a process for manufacturing a circuit board according to the present invention.

Referring now to the drawings, wherein FIGS. 1A-1D illustrate an embodiment of a process for manufacturing a circuit board of this invention. reference numeral 10 denotes a base on which conductive patterns, such as electrical signal lines, are formed. The base 10 can be made of ceramics or a synthetic resin, and in this particular embodiment, the base 10 is made of a polyimide.

As illustrated in FIG. 1A, a conductive adhesive layer 12 is formed on the base 10 according to a prescribed pattern. In this embodiment, the conductive adhesive layer 12 of chromium (Cr) having a width of 20 $\mu$m and a thickness of 0.1 $\mu$m according to a pattern for forming prescribed conductive signal lines is formed by, for example, sputtering because Cr has an effective adhesiveness with polyimide and, therefore, is a good material for use as the conductive adhesive layer 12.

Figure 1B:
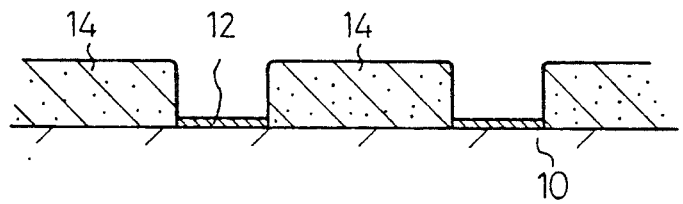

Then, as illustrated in FIG. 1B, an insulative layer 14 is formed on the base 10, except on the region of the conductive adhesive layer 12. In this embodiment, an insulative layer 14 of a polyimide and having a thickness of 10 $\mu$m formed on the base 10, except on the region of the conductive adhesive layers 12; i.e., the insulative layer 14 is formed on the base 10 according to a pattern which is the opposite of the pattern of the conductive adhesive layer 12, to thereby define grooves as shown in FIG. 1B.

Figure 1C:
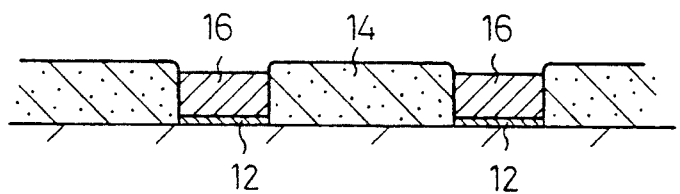

Then, as illustrated in FIG. 1C, conductive parts 16 are formed on the conductive adhesive layer 12. In this embodiment, conductive parts 16 of copper (Cu) are formed by electroplating the conductive adhesive layer 12 with Cu. During this electroplating process, the Cu conductive parts 16 are superimposed on the conductive adhesive layer 12 in such a manner that the respective sides thereof are restricted by the walls of the insulative layer 14, to thereby define prescribed cross-sections of the Cu conductive parts 16.

Figure 1D:
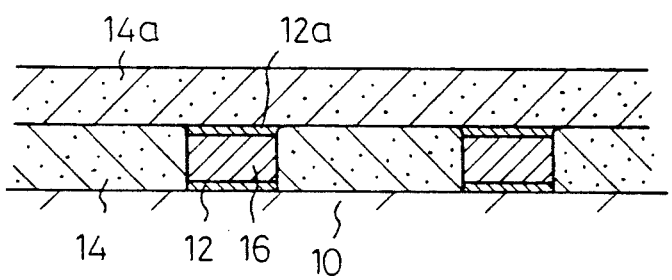

Then, as illustrated in FIG. 1D, a second, covering insulative layer 14a is formed on the first insulative layer 14. In this embodiment, before the covering insulative layer 14a is formed, a second, upper conductive adhesive layer 12a of Cr is further formed on the electroplated Cu conductive parts 16, so that the thickness of the Cu conductive parts 16 corresponds to that of the insulative layer 14. Thereafter, the covering insulative layer 14a is formed on the entire area of the base 10. The Cu conductive parts 16 have a thickness of 9.8 $\mu$m, and the upper conductive adhesive layer 12a of Cr has a thickness of 0.1 $\mu$m. The covering insulative layer 14a is also made of a polyimide.

A circuit board obtained in accordance with the above-mentioned process has a surface roughness of not more than 1 $\mu$m, and has a high surface smoothness.

According to the above-mentioned process, the surface of the underlayer, on which the covering insulative layer 14a is formed, is first made smooth, and therefore, it becomes possible to make the upper surface of the covering insulative layer 14a very smooth without steps or undulations. Accordingly, a process for smoothing the surface of the upper insulative layer can be omitted, to thereby simplify the process of manufacturing a circuit board using a ceramic base. Also, the multi-layer conductive patterns can be easily formed, due to the very smooth surface of the upper insulative layer.

Other embodiments of a process for manufacturing a circuit board, in accordance with the present invention, will now be described with reference to FIGS. 2A and 2B, 3, 4, and 5A and 5B.

Figure 2A:
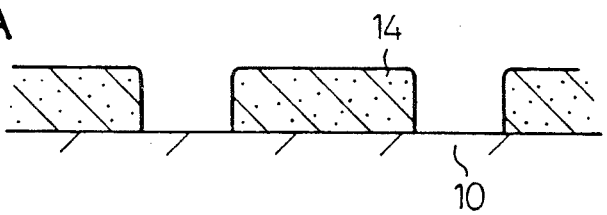
FIGS. 2A and 2B are views illustrating another embodiment of the present invention.
Figure 2B:
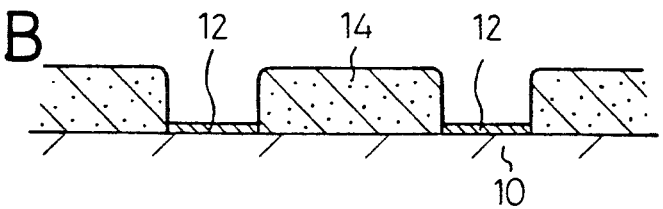

In FIGS. 2A and 2B, contrary to the previous embodiment, the conductive adhesive layer 12 is formed on the base 10 after the insulative layer 14 is formed. FIG. 2A shows the insulative layer 14 of polyimide formed on the base 10, and FIG. 2B shows the conductive adhesive layer 12 of Cr formed on the base 10 except on the region of the insulative layer 14. Thereafter, Cu is electroplated on the conductive adhesive layer 12 to form a circuit board in the same manner as in the previous embodiment.

Figure 3:
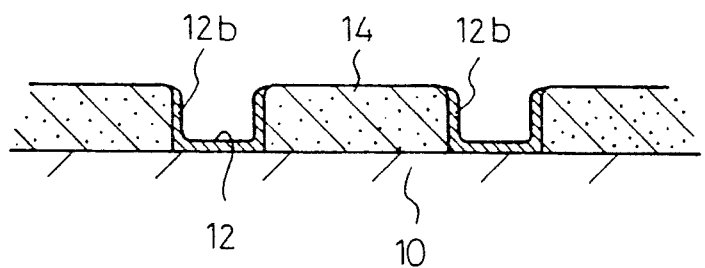
FIGS. 3, 4, and 5A-5C are views illustrating the respective embodiments of the present invention.

As in the previous embodiments, Cu is used for the conductive parts 16 and a polyimide is used for the insulative layer 14. In this case, the Cu may come into contact with the polyimide, and therefore, migration might occur, and thus the Cu might diffuse the polyimide to thereby lower insulation characteristic of the polyimide. To prevent this migration, as illustrated in FIG. 3, after the insulative layer 14 of polyimide is formed, the bottom surface and side walls of the grooves thus formed by the polyimide are coated with the conductive adhesive layers 12a and 12b of Cr, which do not migrate, and thus the Cu is prevented from coming into direct contact with the polyimide when the Cu is electroplated on the surface (Cr) of the base 10.

Figure 4:
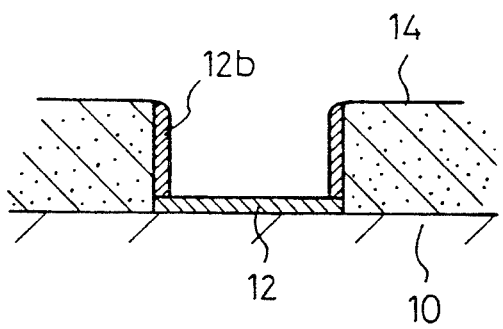

In the previous embodiment shown in FIGS. 1A-1D, the conductive adhesive layer 12a is formed on the conductive parts 16 to prevent a migration of Cu. Also, when the conductive adhesive layer 12b is formed on the inner walls of the groove defined by the insulative layer 14, as in the previous embodiment shown in FIG. 3, a metal of the conductive adhesive layer 12 formed on the bottoms of the grooves, i.e., on the base 10, need not always be the same material as the conductive adhesive layer 12b formed on the side walls of the grooves formed by the polyimide layer FIG. 4 shows an embodiment wherein a metal material of the conductive adhesive layer 12b at the side walls of the grooves is different from that of the conductive adhesive layer 12 at the bottoms of the grooves.

Figure 5A:
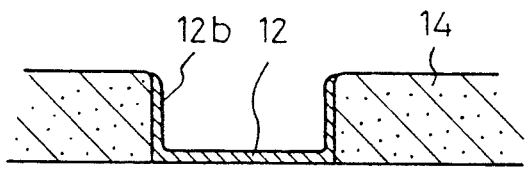
Figure 5B:
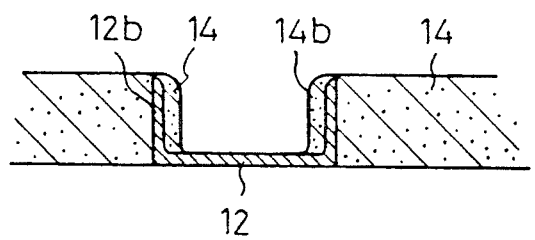

FIGS. 5A-5D illustrate another embodiment of a process for manufacturing a circuit board according to the present invention. In FIG. 5A an insulative layer 14 of polyimide is first formed on the base 10 made of ceramics or a synthetic resin, to thereby define grooves according to a prescribed pattern, and conductive adhesive layers 12 and 12a of Cr are then formed on the bottom surfaces and the side walls of the grooves, respectively. Then, as illustrated in FIG. 5B, only the conductive adhesive layer 12a formed on the side walls of the grooves is coated with the insulative layer 14b of polyimide. Namely, only the conductive adhesive layer 12 formed on the bottoms of the grooves is exposed to the environment.

To form the insulative layer 14 on only the conductive adhesive layer 12b on the side walls of the grooves, a masking is used so that only the side walls covered by the insulative layer 14 are exposed, and thus the polyimide layer is formed on only the conductive adhesive layer 12b. Alternatively, a thin polyimide layer is first formed over the entire area, and then a resist pattern is used to remove the polyimide layer from the bottom surface of the grooves by etching.

After the conductive adhesive layer 12 is exposed to the environment, the conductive parts 16 are electroplated onto the conductive adhesive layer 12, and then a covering insulative layer 12a is formed on the surface of the conductive parts 16, in the same manner as in the embodiment shown in FIGS. 1A-1D. The insulative layer 14 and the conductive metal parts 16 are thereby coated with an insulative layer of polyimide and thus a circuit board similar to that of the embodiment of FIGS. 1A-1D is obtained.

Figure 5C:
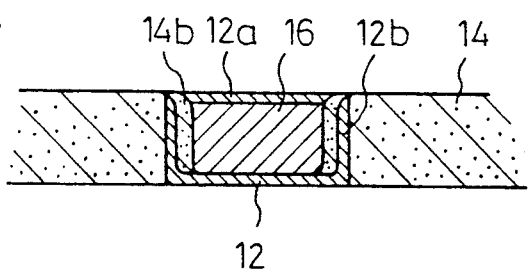
Figure 6A:
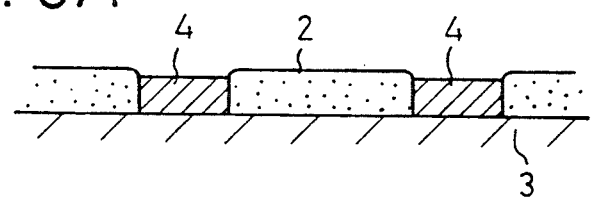
FIG. 6 is a view illustrating a known process for manufacturing a circuit board.
Figure 6B:
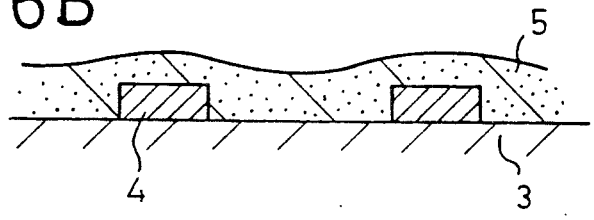

A circuit board obtained in accordance with the process shown in FIGS. 5A-5C has further advantages when compared with the embodiment shown in FIGS. 1A-1D. Namely, in this embodiment, the metal material, such as copper (Cu), for forming the conductive parts 16 can be prevented from coming into direct contact with the insulative layer 14 and, therefore, the forming of the conductive parts 16 can be easily controlled, and thus the surfaces of the conductive parts 16 can be made as smooth as possible, because the electroplated layer is superimposed on the conductive part forming portions on the bottom surfaces of the concave grooves.

Contrary to this, when Cu is electroplated in the embodiments shown in FIGS. 3 and 4, the surfaces of the electroplated parts are not always smooth, due to edging, and therefore, the surfaces of the conductive parts are not always smooth. Nevertheless, when Cu is electroplated as in the embodiment shown in FIGS. 5A-5C, it is possible to obtain a high smoothness of the surface of the electroplated layer.

Although the embodiments are described hereinbefore with reference to the drawings, it should be understood by those skilled in the art that the foregoing description relates to only preferred embodiments of the disclosed invention, and that various changes and modifications may be made to the invention without departing from the spirit and scope thereof.

For example, the present invention can be applied to the manufacture of various circuit boards, and can be used not only for forming usual signal patterns, but also for forming vias or the like. Such vias can be effectively formed, according to this invention, in a substrate or board having multi-layer signal patterns. Also, since an insulative layer is used for forming the patterns, a predetermined cross-sectional area of each conductive pattern can be obtained, and thus fine patterns suitable for high speed electronic systems can be advantageously obtained.

We claim:

1. A circuit board comprising:
   a ceramic base having a substantially flat surface;
   a first insulative layer made of a heat-resisting synthetic resin formed on said flat surface of said ceramic base, said first insulative layer being provided with grooves for forming conductive parts, each of said grooves defined by a bottom surface formed by said ceramic base and side surfaces formed by said first insulative layer;
   a first conductive adhesive layer formed on said bottom surfaces of said grooves, said first conductive adhesive layer having a good adhesive characteristic with respect to said ceramic base, said first conductive adhesive layer formed on said bottom surfaces of said grooves and on said side surfaces of said grooves;
   a conductive layer formed on said conductive adhesive layer;
   a second insulative layer formed between said first conductive adhesive layer provided on said side walls of said grooves and said conductive layer; and
   a second conductive adhesive layer formed on said conductive layer, a thickness of said first insulative layer being substantially the same as a thickness of a conductive part including said conductive layer and said first and second conductive adhesive layers, a surface defined by said second conductive adhesive layer and said first insulative layer is substantially flat.

2. A circuit board as set forth in claim 1, wherein said first and second conductive adhesive layers comprise an element selected from the group consisting of a chromium (cr), molybdenum (Mo), tungsten (W), zirconium (Zr), an alloy of titanium and tungsten (Ti-W), nickel (Ni), cobalt (Co), palladium (Pd), and gold (Au).

3. A circuit board as set forth in claim 1, wherein said conductive layer comprises copper (Cu).

4. A circuit board as set forth in claim 1, wherein said second insulative layer is also formed on said first insulative layer and said second conductive adhesive layer, said second insulative layer having a substantially flat surface.

5. A circuit board as set forth in claim 1, wherein a material of said first conductive adhesive layer formed on said bottom surfaces of said grooves is different from that of said first conductive adhesive layer formed on said side surfaces of said grooves.

6. A process for manufacturing a circuit board, comprising the steps of:
 (a) providing an insulative layer made of a heat-resisting synthetic resin on a ceramic base;
 (b) forming grooves in the insulative layer in accordance with a prescribed pattern for forming signal lines or the like, each of the grooves being defined by a bottom surface formed by the ceramic base and side walls formed by the insulative layer;
 (c) forming a thin first conductive adhesive layer on the bottom surface of the groove;
 (d) forming a conductive layer on the first conductive adhesive layer; and
 (e) forming a second conductive contacting layer on the first conductive adhesive layer and along the side walls of the groove, such that the thickness of the insulative layer is substantially the same as that of conductive portions including the first and second conductive adhesive layers and the conductive layer, the first and second conductive adhesive layers having a good contacting characteristic with respect to the ceramic base and the insulative layer.

7. A process as set forth in claim 6 further comprising the steps of:
 (f) forming a thin conductive adhesive layer on the bottom surface of the groove and on the side walls of the groove;
 (g) forming an additional insulative layer of polyimide on the thin conductive adhesive layer provided on the side walls of the groove; and
 (h) forming the conductive layer by electroplating the bottom surface of the groove.

8. A process as set forth in claim 7, wherein said step (c) includes forming the first conductive adhesive layer on the bottom surface of the groove from a material different from a material used in said step (e) for forming the second conductive adhesive layer on the side walls of the groove.

* * * * *